(12) United States Patent
Casters

(10) Patent No.: US 9,496,969 B1
(45) Date of Patent: Nov. 15, 2016

(54) DOUBLE INTEGRATOR PULSE WAVE SHAPER APPARATUS, SYSTEM AND METHOD

(71) Applicant: Freescale Semiconductor, Inc., Austin, TX (US)

(72) Inventor: Jérôme Jean Pierre Luc Casters, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/752,613

(22) Filed: Jun. 26, 2015

(51) Int. Cl.
*H04B 1/04* (2006.01)
*H04B 14/02* (2006.01)

(52) U.S. Cl.
CPC .................... *H04B 14/023* (2013.01)

(58) Field of Classification Search
CPC .... H04B 1/0475; H04B 1/62; H04B 1/7172; H04B 3/00; H04B 3/04; H04B 3/28; H04B 3/30; H04B 10/25137; H04L 25/03834; H04L 25/028; H04L 25/0286; H04L 25/03828; H04L 25/0384
USPC ................ 375/254, 242, 220, 238, 258, 288
See application file for complete search history.

(56) References Cited

U.S. PATENT DOCUMENTS

| | | | | |
|---|---|---|---|---|
| 4,378,569 A | * | 3/1983 | Dallas, Jr. ............ | G09B 21/006 348/462 |
| 4,520,320 A | * | 5/1985 | Potzick ................... | G01F 1/667 327/237 |
| 5,966,382 A | | 10/1999 | Fawal et al. | |
| 5,966,832 A | * | 10/1999 | Kirkbir ..................... | F26B 7/00 34/182 |
| 7,020,164 B1 | * | 3/2006 | Singleton ............. | H04M 11/062 370/480 |
| 2013/0312590 A1 | * | 11/2013 | Truchsess .............. | G10H 3/146 84/725 |

* cited by examiner

*Primary Examiner* — Siu Lee

(57) ABSTRACT

A pulse wave shaper for reducing the radiation emission level is disclosed. The pulse wave shaper, comprises a first integrator, wherein the first integrator receives a first pulse wave and generates a second pulse wave and a second integrator coupled to the first integrator, wherein the second integrator receives the second pulse wave and generates a third pulse wave with a pulse wave amplitude. The first pulse wave comprises a first pulse wave shape, the second pulse wave comprises a second pulse wave shape, and the third pulse wave comprises a third pulse wave shape. The third pulse wave shape, when transmitted over a bus, generates a reduced radiation emission level.

18 Claims, 4 Drawing Sheets

DOUBLE INTEGRATOR PULSE WAVE SHAPER APPARATUS, SYSTEM AND METHOD

FIELD OF THE INVENTION

The invention relates to a pulse wave shaper circuits, and more particularly, to double integrator wave shaper circuit for bus signal generation systems.

BACKGROUND

A bus, also known as an electrical or communications bus, is a physical electrical interface where more than one device shares the same electric connection. Buses are common in information technology systems, telecommunication systems, commercial electronics, and vehicular systems. Twisted pair cables are two-wire electrical buses and are particularly suitable for use in vehicle systems as they are more robust and simple to install and configure. Various communication protocols may be used on such electrical buses and used to provide communications between electronic components located throughout a vehicle. In particular, airbag systems have many types of components that may be connected to a network. Airbag systems require robust and failsafe communications between the various components to avoid critical system failures or incorrect airbag deployment.

Distributed System Interface (DSI) message protocol is a single master device multiple slave device data communications (electrical) bus implemented on two wires. The bus utilizes voltage modulation (pulse-width modulation) signaling for digital messages sent from the single master device (master) to the slave devices (slaves) and current mode signaling from the slave devices to the master device. Slave devices only transmit in response to messages sent from the master device and are synchronized to the master signals. The DSI message protocol has many versions, including DSI2 and DSI3. Further, buses operating under other protocols, such as the Peripheral Sensor Interface 5 (PSI5) and Local Interconnect Network ("LIN") are common buses providing communication between electrical components of vehicles. LIN is a serial network protocol used for communication between components in vehicles.

According to the DSI message protocol, slave responses to commands are sent using a modulated current signal, which is self-synchronized to a falling edge voltage from the master voltage signal. Master and slave devices transmit simultaneously, i.e. the DSI is a duplex system of communication. During the response time the master device sends a pulse train of any combination of ones or zeros. The current mode bits are sent during the bit time and sampled by the master device at the falling edge of the voltage pulse generated by the master device. When the slave device produces a logical one, the slave device draws additional current above a particular threshold from the electrical bus during the bit time. If a logical zero is transmitted the slave device does not draw additional current during the bit time. The master device detects the current drawn from the electrical bus at a predetermined point in the bit time, i.e. the sampling point, to determine the bit type transmitted by the slave device.

In the prior art, when the master voltage pulse is generated, some current flows from the master device to ground through a set of distributed or parasitic capacitors. The capacitors are stray parasitic capacitors coupled between the pair of wires and the chassis. This current loop acts as an antenna whose radiative emissions exceed the protocol limits. This is particularly critical for single-ended buses such as DSI3, PSI5 and LIN where the common mode is proportional to the signal. Current PSI5 transceivers exceed the emission limits because of prior art master to slave communications. The master voltage pulse typically takes the form of a square wave with constant rising and falling edges when transmitted over the bus. The master voltage pulse may also take the form of a trapezoidal wave with constant edge slopes.

Methods to reduce the radiation emissions of the prior art typically involve the use of complex look-up tables or require signal filtering. Signal filtering to reduce the radiation emissions requires adjustments to the filtering based upon varying frequency while the use of look-up tables is limited to digital signal generation. Therefore, an improved method and system for the reduction of radiative emissions during digital and analog bus signal transmissions is desired.

BRIEF DESCRIPTION OF THE DRAWINGS

A more complete appreciation of the invention is provided by reference to the following detailed description of the appended drawings and figures. The following descriptions, in conjunction with the appended figures, enable a person having skill in the art to recognize the numerous advantages and features of the invention by understanding the various embodiments. These drawings are provided to facilitate the reader's understanding of the invention and shall not be considered limiting of the breadth, scope, or applicability of the invention. It should be noted that for clarity and ease of illustration these drawings are not necessarily made to scale. The following figures are utilized to best illustrate these features.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE INVENTION

A pulse wave shaper, according to one embodiment, is configured to transform a square pulse wave in to a parabolic wave to reduce the radiative emissions of the pulse wave when transmitted over a bus. The pulse wave shaper implements two integrators, in serial, to transform the pulse wave.

The first integrator receives the square wave form from a pulse wave generator. The first integrator transforms the pulse wave in to a saw-tooth pulse wave form and transmits the saw-tooth pulse wave form to the second integrator. The second integrator transforms the pulse wave in to a parabolic pulse wave form. The parabolic pulse wave form is then transmitted over the bus. The parabolic pulse wave form produces less radiative emissions than the radiative emissions from a prior art pulse waves, such as a square pulse wave.

Figure 1:
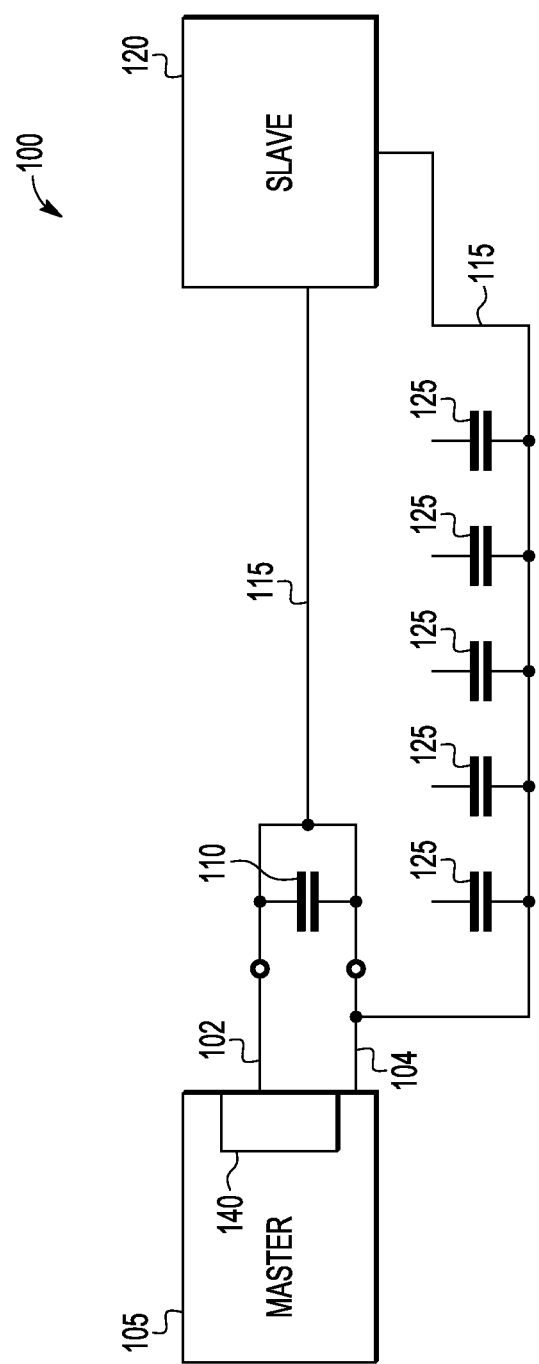
FIG. 1 is a diagram of a bus signal generation system according to one embodiment of the invention.

Referring now to FIG. 1, an exemplary bus signal generation system 100 in accordance with one embodiment of the invention is illustrated. The bus signal generation system is implementable, in one embodiment, in a vehicle or an automobile, however, a wide variety of systems may be implemented without detracting from the spirit of the invention, including network systems, information technology systems, telecommunication systems, commercial and retail electronics, and any system suited to emission reduction. Further, a wide variety of communication buses may be implemented without detracting from the spirit of the invention, including twisted pair cables and two-wire electrical buses. A master device 105 transmits a bus signal over a high line 102 and a low line 104 to a slave device 120. In one embodiment, the master device 105 is a data transfer device and the slave device 120 is a remote device such as a sensor. The signal is voltage modulated across capacitor 110 and a voltage modulated signal is transmitted over a bus 115 to a slave device 120. In one embodiment, the voltage modulated signal is transmitted over a twisted-pair electrical cable including the high line 102 and low line 104. In another embodiment, the master device 105 is a microcontroller, such as an air bag microcontroller, and the slave device 120 is a sensor. In this embodiment, the microcontroller sends and receives data from the sensor through the voltage modulated signal transmitted over the bus 115. Data transmitted to and from the sensor includes, but is not limited to, pressure readings, gyroscope signals, and distance from a target.

The master device 105 and the slave device 120 form a network system linked by the electrical bus 115. Stray, or parasitic, capacitors 125 couple the voltage modulated signal to the chassis which acts as a global ground ("0" volts). The strength of the stray capacitors 125 is determined by the physical constraints on the wiring between the master device 105 and the slave device 120 such the cable length and the distance between the cable harness and the chassis. The sum of the strength of the stray capacitors 125 may add up to hundreds of pF. In the prior art, the master device generates the pulse with some slew rate limitations. This is not optimal for radiated emission as shown later. The slave device 120 transmits a current mode signal from the slave device 120 to the master device 105 and is in effect a current source. In the prior art, when a master voltage pulse and current mode signal are generated, the current flows through the stray capacitors 125 and is followed by the common mode voltage with an attenuation of 6 dB. This problem is particularly critical for single ended buses such as DSI3 and PSI5 where the common mode voltage is proportional to the signal. Current PSI5 transceivers exceed the emission limits because of prior art master to slave communications. The emissions of the master voltage pulse of the bus signal generation system, according to one embodiment of the invention, reduce the emissions to below the levels required by PSI5. The current through a stray capacitor 125 is calculated as:

$$I = C \times dV/dt$$

where "I" is the current, "C" is the capacitance of the stray capacitor 125, and "dV/dt" is the first derivative of the signal voltage with respect to time. The radiative term of an antenna is proportional to the current derivative which is given by the following equation:

$$dI/dt = C \times d^2V/dt^2$$

This equation shows that the radiated energy may be minimized by reducing the second derivative of "V", voltage with respect to time. Thus, the use of a first and second integrators to the original signal produces a parabolic shape which reduces the radiated emissions due to the controlled and fixed curvature of the parabolic shape.

Figure 5:
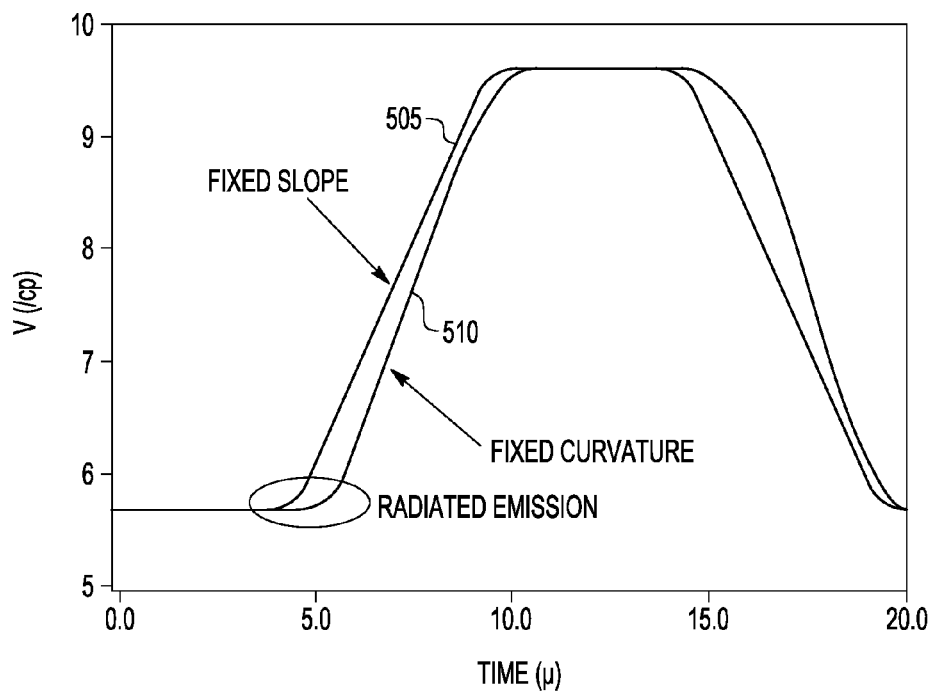
FIG. 5 is a chart of the pulse wave shape according to the prior art and the invention.

In one embodiment, the master device 105 includes a pulse wave shaper system 140. The pulse wave shaper system 140 includes a pulse wave generator that generates a square wave with a set amplitude. The square wave is transmitted to a first integrator which transforms the square wave in to a saw-tooth wave. An integrator is a component whose output signal is the time integral of its input signal. The saw-tooth wave is transmitted to a second integrator which transforms the saw-tooth wave in to a parabolic wave. The first and second integrators may be analog or digital. If digital integrators are implemented, a digital-to-analog converter is coupled to the output of the second integrator to convert the output signal to analog prior to transmission over the bus. One embodiment of a pulse wave shaper system 140 is disclosed in FIG. 2. The transformation of the square wave to a parabolic wave reduces the radiation emissions from the signal when transmitted over a network or bus. Referring now to FIG. 5, the pulse wave shapes of the prior art trapezoidal wave and parabolic wave shape according to one embodiment of the invention are shown. The constant edge slope of the trapezoidal wave shape 505 is shown on both the rising and falling edges. The parabolic shaped edge of the parabolic wave shape 510 is shown on the rising and falling edge. The parabolic wave shape 510 is suited to the reduction of radiation emissions compared to the constant slope edges of the square wave 505. The parabolic wave is frequency independent and does not require filtering to reduce radiative emissions.

Returning now to FIG. 1, a radiative loop is present in the bus signal generation system 100 and passes from the master device 105, across the bus to the slave device 120 and returns to the master device 105. In one embodiment, the radiative loop passes from the master device 105, through the high line 102 to the slave device 120 and returns to the master device through the low line 104 and stray capacitors 125. The parabolic wave 510, when transmitted from the master device 105 to the slave device 120, reduces the radiative emissions when compared to the radiative emissions of the prior art square or trapezoidal wave 505 transmissions.

Figure 2:
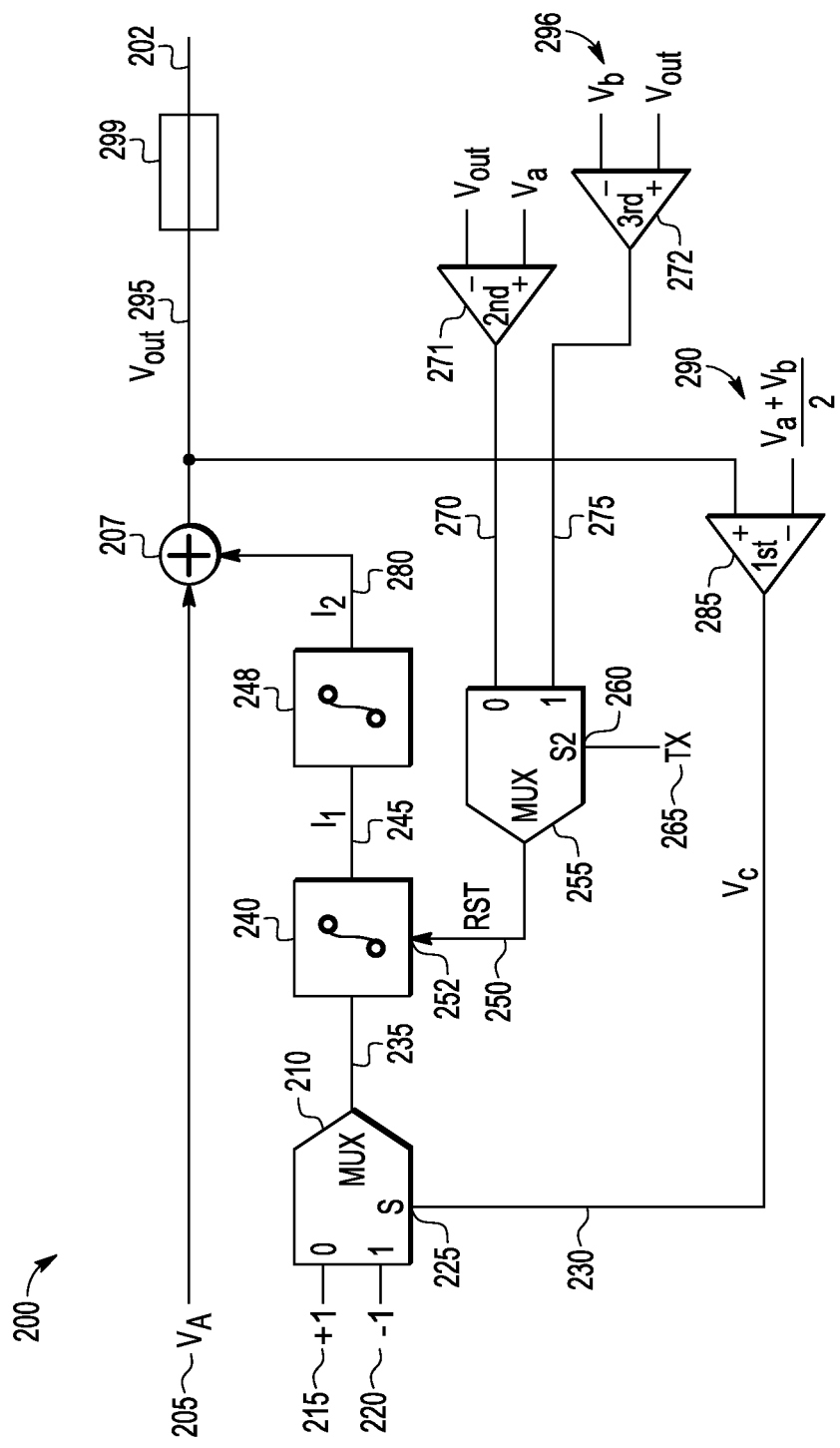
FIG. 2 is a diagram of a pulse wave shaper circuit according to one embodiment of the invention.

Referring now to FIG. 2, a diagram of the pulse wave shaper circuit 200 according to one embodiment of the invention is provided. Power sources Va 205 and Vb 296 are shown. Both Va 205 and Vb 296 have a set voltage and do not change during the pulse wave shaper circuit 200 operation. Va 205 and Vb 296 may be either analog or digital. In one embodiment, Va 205 and Vb are implemented in a digital format with digital codes. In another embodiment, Va 205 is set to the low level voltage while Vb 296 is set to the high level voltage. In one embodiment, Va 205 is set to 6 V while Vb 296 is set to 10 V. The pulse wave shaper circuit 200 generates a signal that transitions between these two voltage levels.

A first multiplexer (or "mux") 210 is shown and is a device that selects one of several input signals, either analog or digital, and transmits the selected input into a single line. A multiplexer of 2n inputs has n select lines, which are used to select which input line to send to the output. In one embodiment, the mux 210 includes two (2) input lines and one (1) selection line. Multiplexers may also be used to increase the amount of data that can be sent over the network within a certain amount of time and bandwidth. The first mux 210 includes a negative input line (+1) 215 and a positive input line (−1) 220. Based upon the selection signal input (S) 225, the mux 210 transmits a positive or a negative mux signal 235 to a first integrator 240. In one embodiment, when the section signal input (S) 225 is "Low", the mux signal 235 is set to a positive value corresponding to the negative input line (+1) 215, and when the section signal input (S) 225 is "High", the mux signal 235 is set to a negative value corresponding to the positive input line (−1) 220. In one embodiment, the mux signal 235, positive input line (+1) 215 and negative input line (−1) 220 are analog. The selection signal input (S) 225 of the first mux 210 is coupled to the output of a first comparator 285. A comparator is a device that compares two voltages or currents and outputs a digital signal indicating which is larger. It typically has two analog input terminals and one binary digital output. The output is ideally a "High" when certain criteria are met and a "Low" when a separate set of criteria are met. The positive input of the first comparator 285 is coupled to Vout 295. The negative input to the first comparator is coupled to the voltage sum of Va 205 plus Vb 296 divided by 2 (Va 205+Vb 296)/2 "the midpoint voltage") where Va 205 is the lower transmission level and Vb 296 is the higher transmission level. When the Vout 295 voltage is greater than the midpoint voltage 290, then the first comparator 285 selects the positive input and transmits a digital "High" Vc 230 to the selection signal input (S) 225 of the first mux 210. When the midpoint voltage 290 is greater than or equal to the Vout 295 voltage, the first comparator 285 selects the negative input and transmits a digital "Low" Vc 230 to the selection signal input (S) 225.

The first integrator 240 generates a first integrator signal (I1) 245 and transmits the first integrator signal (I1) to a second integrator 248. The second integrator 248 generates a second integrator signal (I2) 280 and transmits the second integrator signal (I2) 280 to an adder 207. An adder, also known as a "summing amplifier" is used for combining the voltage present on multiple inputs into a single output voltage. The adder 207 combines the Va 205 voltage with the second integrator signal (I2) voltage to produce the Vout 295 voltage. A line driver 299 is coupled to Vout 295. The line driver 299 is an amplifier used to improve the strength of an analog or digital signal by driving the input to a bus 202, or a transmission line, with a higher than normal signal level.

At startup, the first integrator signal (I1) 245 and second integrator signal (I2) 280 are both set to zero ("0"). The first integrator 240 includes a reset input 252. The reset input 252 is coupled to a second mux 255. The second mux 255 includes a selection input signal (S2) 260 which is attached to a transmit signal (TX) from a processing unit such as a microcontroller unit. The second mux 255 includes a negative input line 270 and a positive input line 275. Based upon the selection signal input (S2) 260, the second mux 255 transmits a positive or a negative mux signal 250 to the reset input 252 of the first integrator 240. In one embodiment, when the section signal input (S2) is "Low", the mux signal 250 is set to a positive voltage corresponding to the negative input line 270, and when the section signal input (S2) is "High", the mux signal 250 is set to the positive input line 275. The negative input line 270 is coupled to the output of a second comparator 271. The positive input of the second comparator 271 is coupled to Va 205. The negative input to the second comparator is coupled to Vout 295. When the Vout 295 voltage is greater than Va 205 voltage, then the second comparator 271 transmits a digital "Low" to the second mux 255. When Va 205 voltage is greater than or equal to the Vout 295 voltage, the second comparator 271 transmits a digital "High" to the second mux 255. The positive input line 275 is coupled to the output of a third comparator 272. The negative input of the third comparator 272 is coupled to Vb 296. The positive input of the third comparator is coupled to Vout 295. When the Vb 296 voltage is greater than the Vout 295 voltage, then the third comparator 272 transmits a digital "Low" to the second mux 255. When Vout 295 voltage is greater than or equal to the Vb 296 voltage, the third comparator 272 transmits a digital "High" to the second mux 255.

Figure 3:
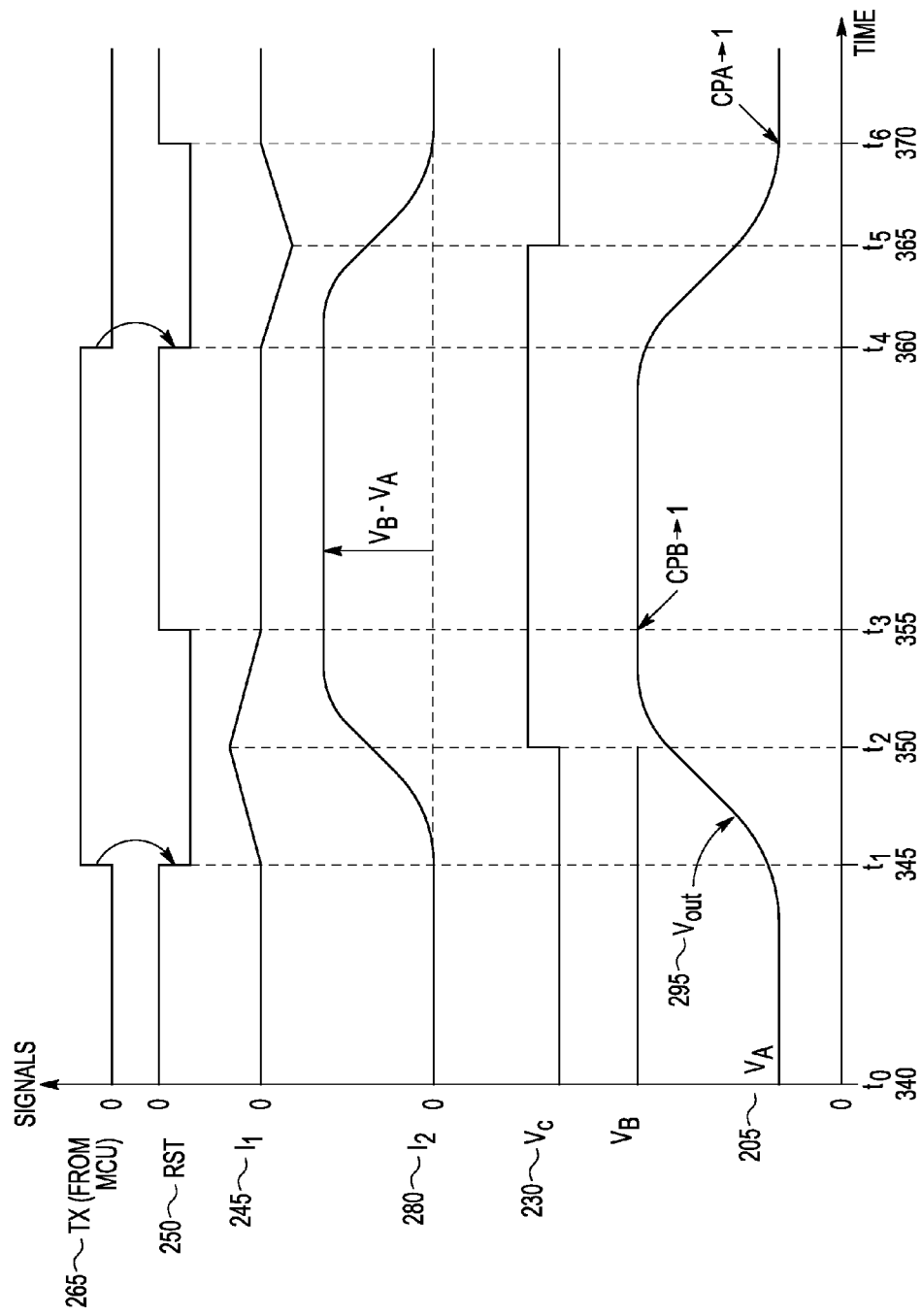
FIG. 3 is a chart of the output voltages of the components of the pulse wave shaper circuit according to one embodiment of the invention.

Referring now to FIG. 3, the outputs of the components of the pulse wave shaper system 140 according to one embodiment of the invention are shown. At times t0 340, t1 345, t2 350, t3 355, t4 360, t5 365, and t6 370, the voltages of the outputs of the components of the pulse wave shaper system 140 are shown. During the sequence, Va 205 is set to fixed level corresponding to the lower level of the voltage transmission while Vb 296 is set to a fixed level corresponding to the upper level of the voltage transmission. At time t0 340, I2 280, I1 245, and TX 265 are all set to a zero ("0") voltage. Vout 295 is then equal to Va 205 because Vout 295 is the summation of I2 280 and Va 205. The first integrator 240 and second integrator 248 are initially set to ("0"). The output of the second comparator 271 is "High" because the output level Vout 295 is equal to Va 205. The positive input 270 of the second mux 255 is selected because the transmit signal (TX) 265 is set to ("0"). Consequently, the RST signal 250 is "High" which maintains the output of the first integrator 240 at zero ("0"). As the first integrator signal (I1) is set to zero, the second integrator signal (I2) does not change. It stays at "0".

At time t1 345, the transmit signal (TX) 265 is set "High." The second mux 255 selects the negative input 275 which is the output of the third comparator 272 which is zero ("0") as Vb 296 is greater than Vout 295. The reset input 252 receives the "High" mux signal 250, changing the status of the first integrator 240 from "reset" to "integrating." The first comparator 285 selects the negative input 290 and transmits a "Low" Vc 230 to the first mux 210. The first mux 210 selects the positive input 215 and transmits the mux signal 235 as "High" to the first integrator 240. The first integrator 240 generates a positive slope ramp, such as a saw-tooth wave form, at the first integrator signal 245. The second integrator 248 receives the positive slope ramp and generates a parabolic signal in the second integrator signal 280. The second integrator signal 280 rises quadratically.

At time t2 350, the first comparator 285 detects that the output from the second integrator 248 has reached the amplitude midpoint ((Va plus Vb)/2) and selects the positive input 290 and transmits a digital "High" Vc 230 to the selection signal input (S) 225 of the first mux 210. In response, the first mux 210 selects the negative input 220 and transmits a negative amplitude square wave mux signal 235 to the first integrator 240. The first integrator 240 generates the downward portion of the saw-tooth signal (the signal falls linearly) and transmits this downward portion of the saw-tooth wave form in the first integrator signal (I1) 245. The second integrator 248 receives the downward portion of the saw-tooth wave form in the first integrator signal (I1) 245 and generates the second integrator signal (I2) 280. The second integrator 248 continues to generate a positive second integrator signal 280 as the first integrator signal (I1) 245 remains positive, but the amount of increase in the second integrator signal (I2) 280 continues to decline as shown by FIG. 3. The second integrator signal 280 rises quadratically but with a negative curvature.

At time t3 355, the third comparator 272 detects that the Vout 295 voltage has reached the target voltage of Vb 296. The third comparator 272 gives a "High" level over the positive input line 275 to the second mux 255. The TX signal 265, the selection channel of second mux 255, being "High", keeps the first integrator in reset. The first integrator signal (I1) 245 being equal to zero ("0"), the second integrator 248 output, I2 280, does not change and Vout stays on the target level Vb 296.

At t4 360, the second comparator 271 transmits a "Low" as Vout 295 is greater than Va 205. The TX signal 265 is set "Low". The negative input 270 of second mux 255 is selected. The first integrator goes out of reset. I1 starts decreasing linearly (it is now negative). I2 decreases quadratically because a negative linearly decreasing quantity is integrated.

At t5 365, the first comparator 285 detects that Vout 295 has crossed the midpoint of the sum of Va plus Vb/2 and transmits a "Low" value on Vc 230. The first mux 210 selects the positive input 215 and transmits the mux signal 235 to the first integrator 240. The first integrator 240 now integrates a positive value. It's the first integrator signal (I1) 245 remains negative but increases linearly. The second integrator 248 integrates a negative quantities increasing linearly. This makes the value of second integrator signal (I2) 280 decrease with a positive curvature.

At t6 370, the second comparator 271 detects that Vout 295 is on target (when the second integrator signal (I2) 280 is zero ("0")) and transmits a "High" to the second mux 255. As TX 265 remains zero ("0"), the negative input line 270 is directly routed by the second mux 255 to the reset input 252 of the first integrator 240 and the first integrator signal (I1) 245 is zero ("0"). The second integrator signal (I2) 280 remains steady at zero ("0"). The process is ready to start again.

Figure 4:
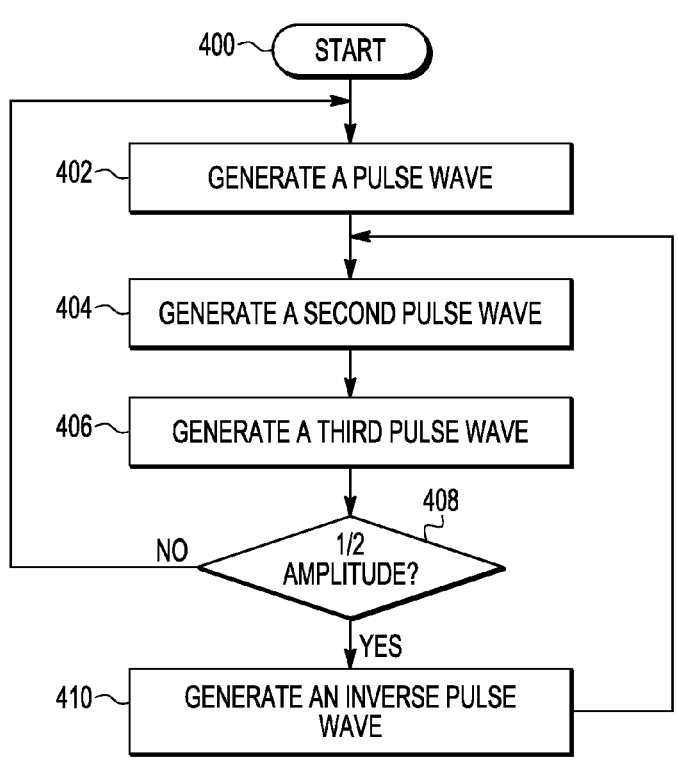
FIG. 4 is a flow chart depicting the method of generating a pulse wave shaped signal according to one embodiment of the invention.

Referring now to FIG. 4, a flow diagram depicting the method of shaping a pulse wave according to one embodiment of the invention is shown. The process begins with Start 400. A pulse wave is generated in step 402. In one embodiment, the pulse wave is a square wave generated by a pulse wave generator and transmitted by a multiplexer, however, a wide variety of components may be used to generate a pulse wave of varying amplitudes. The pulse wave has a radiative emission level when transmitted over a bus. In step 404, a second pulse wave is generated. In one embodiment, the second pulse wave is generated by an integrator. The input from the pulse wave generator or multiplexer is received by the integrator and is used by the integrator to generate the second pulse wave. The second pulse wave may be in the saw-tooth wave form. In step 406 a third pulse wave is generated. In one embodiment, the third pulse wave is generated by a second integrator. The output from the first integrator is received by the second integrator and is used by the second integrator to generate the third pulse wave. The third pulse wave may be in a parabolic wave form. The third pulse wave has a radiative emission level when transmitted over the bus. The radiative emission level of the third pulse wave is less than the first pulse wave. In step 408 the amplitude of the third pulse wave is determined. If the amplitude of the third pulse wave is less than or equal to one-half (½) of the expected amplitude of the full third pulse wave, then the process continues with the generation of the pulse wave. If the amplitude of the third pulse wave is greater than one-half (½) of the expected amplitude of the full third pulse wave, an negative amplitude pulse wave is generated and transmitted to generate a second pulse wave in step 410. In one embodiment, the first integrator generates the downward slope of the second pulse wave in response to receiving the negative amplitude pulse wave. The downward slope of the second pulse wave is transmitted to the second integrator.

In one embodiment, a pulse wave shaper for reducing the radiation emission level is disclosed. The pulse wave shaper, comprising a first integrator, wherein the first integrator receives a first pulse wave and generates a second pulse wave; a second integrator coupled to the first integrator, wherein the second integrator receives the second pulse wave and generates a third pulse wave with a pulse wave amplitude; wherein the first pulse wave comprises a first pulse wave shape; wherein the second pulse wave comprises a second pulse wave shape; wherein the third pulse wave comprises a third pulse wave shape; and wherein the third pulse wave shape when transmitted over a bus generates a reduced radiation emission level. Wherein the first pulse wave shape is a square wave, the second pulse wave shape is a saw tooth wave, and the third pulse wave shape is a parabolic wave. Wherein a negative amplitude pulse wave is received by the first integrator when the third pulse wave reaches a midpoint of the pulse wave amplitude, the first integrator generates a downward slope of the saw tooth wave when the first integrator receives the negative amplitude pulse wave, and the second integrator generates a positive parabolic wave with the amount of increase in the parabolic wave declining when the second integrator receives the downward sloping saw tooth wave. Wherein the first and second integrators are digital integrators or analog integrators.

In another embodiment, a bus signal generation system with a pulse shaper is disclosed. The bus signal generation system comprising a pulse wave generator; a pulse shaper coupled to the pulse wave generator, the pulse shaper further comprising: a first integrator, wherein the first integrator receives a first pulse wave from the pulse wave generator, wherein the first integrator generates a second pulse wave; a second integrator coupled to the first integrator, wherein the second integrator receives the second pulse wave from the first integrator and wherein the second integrator generates a third pulse wave; a line driver coupled to the second integrator, the line driver receiving the third pulse wave and generating a signal over a bus; a comparator coupled to the pulse wave generator and at least two voltage sources, the comparator generating a signal for receipt by the pulse wave generator; wherein the input of the pulse wave generator switches to the negative amplitude pulse wave upon receipt of a signal from the comparator, the comparator signal associated with the third pulse wave crossing a threshold corresponding to the pulse wave amplitude; wherein the first pulse wave comprises a first pulse wave shape; wherein the second pulse wave comprises a second pulse wave shape; and wherein the third pulse wave comprises a third pulse wave shape. Wherein the third pulse wave shape when transmitted over a bus generates a reduced radiation emission level. The bus signal generation system further comprising a digital to analog converter coupled to the second integrator and the line driver, wherein the digital to analog converter receives a digital signal from the second integrator and wherein the digital to analog converter receives the third pulse wave and generates an analog signal for receipt by the line driver. The bus signal generation system, wherein the first pulse wave shape is a square wave, the second pulse wave shape is a saw tooth wave, and the third pulse wave shape is a parabolic wave. The bus signal generation system further comprising a microcontroller coupled to the pulse wave generator; and a sensor coupled to the line driver and the microcontroller. Wherein the microcontroller transmits and receives data from the sensor and the line driver is coupled to the sensor over a twisted pair cable bus. The bus signal generation system further comprising a capacitor coupled to the bus and a ground wherein the capacitor is a stray capacitor. The bus signal generation system, wherein the output of the pulse wave generator switches to the negative amplitude pulse wave upon receipt of a signal from the comparator that the third pulse wave has crossed the one-half point of the pulse amplitude.

In another embodiment, a method of shaping a pulse wave to reduce the radiation emission level is disclosed. The method comprising the steps of generating a first pulse wave; generating a second pulse wave in response to receipt of the first pulse wave; generating a third pulse wave with a wave amplitude in response to receipt of the second pulse wave; determining if the wave amplitude is greater than one half of the expected wave amplitude; and generating an negative amplitude first pulse wave in response to determining the wave amplitude is greater than one half of the expected wave amplitude. Wherein the first pulse wave comprises a first pulse wave shape, the second pulse wave comprises a second pulse wave shape, and the third pulse wave comprises a third pulse wave shape and generates a reduced radiation emission level. Wherein the first pulse wave shape is a square wave, the second pulse wave shape is a saw tooth wave, and the third pulse wave shape is a parabolic wave. Wherein the second pulse wave is generated by a first integrator and the third pulse wave is generated by a second integrator.

Although the invention is described herein with reference to specific embodiments, various modifications and changes can be made without departing from the scope of the invention as set forth in the claims below. Accordingly, the specification and figures are to be regarded in an illustrative rather than a restrictive sense, and all such modifications are intended to be included within the scope of the invention. Any benefits, advantages, or solutions to problems that are described herein with regard to specific embodiments are not intended to be construed as a critical, required, or essential feature or element of any or all the claims.

From time-to-time, the invention is described herein in terms of these example embodiments. Description in terms of these embodiments is provided to allow the various features and embodiments of the invention to be portrayed in the context of an exemplary application. After reading this description, it will become apparent to one of ordinary skill in the art how the invention can be implemented in different and alternative environments. Unless defined otherwise, all technical and scientific terms used herein have the same meaning as is commonly understood by one of ordinary skill in the art to which this invention belongs.

The preceding discussion is presented to enable a person skilled in the art to make and use the invention. The general principles described herein may be applied to embodiments and applications other than those detailed below without departing from the spirit and scope of the invention as defined by the appended claims. The invention is not intended to be limited to the embodiments shown, but is to be accorded the widest scope consistent with the principles and features disclosed herein.

In addition, while a particular feature of the invention may have been disclosed with respect to only one of several embodiments, such feature may be combined with one or more other features of the other embodiments as may be desired. It is therefore, contemplated that the claims will cover any such modifications or embodiments that fall within the true scope of the invention.

The various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one", "one or more" or the like; and adjectives such as "conventional", "traditional", "normal", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more", "at least", "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Unless stated otherwise, terms such as "first" and "second" are used to arbitrarily distinguish between the elements such terms describe. Thus, these terms are not necessarily intended to indicate temporal or other prioritization of such elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A pulse wave shaper for reducing the radiation emission level, the pulse wave shaper comprising:
   a first integrator, wherein
       the first integrator receives a first pulse wave and generates a second pulse wave,
       the first pulse wave comprises a first pulse wave shape wherein the first pulse wave shape is a square wave,
       the second pulse wave comprises a second pulse wave shape wherein the second pulse wave shape is a saw tooth wave;
   a second integrator coupled to the first integrator, wherein
       the second integrator receives the second pulse wave and generates a third pulse wave with a pulse wave amplitude,
       the third pulse wave comprises a third pulse wave shape wherein the third pulse wave shape is a parabolic wave,
       the third pulse wave shape when transmitted over a bus generates a reduced radiation emission level, and
       a negative amplitude pulse wave is received by the first integrator when the third pulse wave reaches a midpoint of the pulse wave amplitude.

2. The pulse wave shaper of claim 1, wherein first integrator generates a downward slope of the saw tooth wave when the first integrator receives the negative amplitude pulse wave.

3. The pulse wave shaper of claim 2, wherein the second integrator generates a positive parabolic wave with the amount of increase in the parabolic wave declining when the second integrator receives the downward sloping saw tooth wave.

4. The pulse wave shaper of claim 1, wherein the first and second integrators are digital integrators.

5. The pulse wave shaper of claim 1, wherein the first and second integrators are analog integrators.

6. A bus signal generation system with a pulse shaper, the bus signal generation system comprising:
   a pulse wave generator;
   a pulse shaper coupled to the pulse wave generator, the pulse shaper further comprising
       a first integrator, wherein the first integrator receives a first pulse wave from the pulse wave generator, wherein the first integrator generates a second pulse wave, and
       a second integrator coupled to the first integrator, wherein the second integrator receives the second pulse wave from the first integrator and wherein the second integrator generates a third pulse wave;
   a line driver coupled to the second integrator, the line driver receiving the third pulse wave and generating a signal over a bus;
   a comparator coupled to the pulse wave generator and at least two voltage sources, the comparator generating a signal for receipt by the pulse wave generator;
   wherein an input of the pulse wave generator switches to a negative amplitude pulse wave upon receipt of a signal from the comparator, the comparator signal associated with the third pulse wave crossing a threshold corresponding to a pulse wave amplitude;
   wherein the first pulse wave comprises a first pulse wave shape;
   wherein the second pulse wave comprises a second pulse wave shape; and
   wherein the third pulse wave comprises a third pulse wave shape.

7. The bus signal generation system of claim 6, further comprising a digital to analog converter coupled to the second integrator and the line driver, wherein the digital to analog converter receives a digital signal from the second integrator.

8. The bus signal generation system of claim 7, wherein the digital to analog converter receives the third pulse wave and generates an analog signal for receipt by the line driver.

9. The bus signal generation system of claim 6, wherein the first pulse wave shape is a square wave, the second pulse wave shape is a saw tooth wave, and the third pulse wave shape is a parabolic wave.

10. The bus signal generation system of claim 6 further comprising:
    a microcontroller coupled to the pulse wave generator; and
    a sensor coupled to the line driver and the microcontroller.

11. The bus signal generation system of claim 10, wherein the microcontroller transmits and receives data from the sensor.

12. The bus signal generation system of claim 10, wherein the line driver is coupled to the sensor over a twisted pair cable bus.

13. The bus signal generation system of claim 10 further comprising a capacitor coupled to the bus and a ground.

14. The bus signal generation system of claim 13, wherein the third pulse wave shape when transmitted over a bus generates a reduced radiation emission level.

15. The bus signal generation system of claim 6, wherein an output of the pulse wave generator switches to the negative amplitude pulse wave upon receipt of a signal from the comparator that the third pulse wave has crossed the one-half point of the pulse wave amplitude.

16. A method of shaping a pulse wave to reduce the radiation emission level, the method comprising:
    generating a first pulse wave comprising a first pulse wave shape;
    generating a second pulse wave in response to receipt of the first pulse wave, wherein the second pulse wave comprises a second pulse wave shape;
    generating a third pulse wave with a wave amplitude in response to receipt of the second pulse wave, wherein the third pulse wave comprises a third pulse wave shape and generates a reduced radiation emission level;
    determining if the wave amplitude is greater than one half of an expected wave amplitude; and
    generating an negative amplitude first pulse wave in response to determining the wave amplitude is greater than one half of the expected wave amplitude.

17. The method of claim 16, wherein the first pulse wave shape is a square wave, the second pulse wave shape is a saw tooth wave, and the third pulse wave shape is a parabolic wave.

18. The method of claim 17, wherein the second pulse wave is generated by a first integrator and the third pulse wave is generated by a second integrator.

\* \* \* \* \*